(12) United States Patent
Tang

(10) Patent No.: US 10,629,762 B2
(45) Date of Patent: Apr. 21, 2020

(54) INFINITELY EXTENDING SOLAR BATTERY MODULE BASED ON MAGNETICALLY EXTENDED CIRCUIT

(71) Applicant: Shanghai Okagawa Technology Co., Ltd., Shanghai (CN)

(72) Inventor: Song Tang, Hulunbuir (CN)

(73) Assignee: SHANGHAI OKAGAWA TECHNOLOGY CO., LTD., Shanghai (CN)

(*) Notice: Subject to any disclaimer, the term of this patent is extended or adjusted under 35 U.S.C. 154(b) by 0 days.

(21) Appl. No.: 16/312,050

(22) PCT Filed: Jun. 19, 2017

(86) PCT No.: PCT/CN2017/089019
§ 371 (c)(1),
(2) Date: Dec. 20, 2018

(87) PCT Pub. No.: WO2017/219949
PCT Pub. Date: Dec. 28, 2017

(65) Prior Publication Data
US 2019/0165197 A1 May 30, 2019

(30) Foreign Application Priority Data

Jun. 23, 2016 (CN) .......................... 2016 1 0458782

(51) Int. Cl.
*H01L 31/00* (2006.01)
*H01L 31/05* (2014.01)
*H02S 40/36* (2014.01)
*H02S 40/38* (2014.01)
*H02J 7/35* (2006.01)

(52) U.S. Cl.
CPC .......... *H01L 31/0512* (2013.01); *H01L 31/05* (2013.01); *H02J 7/35* (2013.01); *H02S 40/36* (2014.12); *H02S 40/38* (2014.12); *Y02E 10/50* (2013.01)

(58) Field of Classification Search
CPC ................................ H02S 40/36; H02J 7/355
See application file for complete search history.

(56) References Cited

U.S. PATENT DOCUMENTS

| 5,009,243 A | 4/1991 | Barker |
| 2012/0017967 A1 | 1/2012 | Moon et al. |

(Continued)

FOREIGN PATENT DOCUMENTS

| CN | 102769057 A1 | 11/2012 |
| CN | 203300662 B1 | 11/2013 |
| CN | 105957914 A1 | 9/2016 |

(Continued)

*Primary Examiner* — Angelo Trivisonno
(74) *Attorney, Agent, or Firm* — Cherskov Flaynik & Gurda, LLC

(57) ABSTRACT

An infinitely extendable solar cell module based on a circuit extendable through magnetic engagement is provided. The solar cell module comprises a circuit, a battery piece, a transparent layer, and a magnetic engagement element. The battery piece is connected with the magnetic engagement element by the circuit, the battery module is adapted to be connected to another battery module by the magnetic engagement element, and the transparent layer is on the surface of the battery module.

4 Claims, 2 Drawing Sheets

(56) References Cited

U.S. PATENT DOCUMENTS

2013/0284243 A1* 10/2013 Jeong .................. H01L 31/0504
                                                      136/251
2016/0204293 A1*  7/2016 Nakai .................... H02S 40/36
                                                      320/101

FOREIGN PATENT DOCUMENTS

CN        104009107 B1    1/2017
CN        205920982 B1    2/2017

* cited by examiner

INFINITELY EXTENDING SOLAR BATTERY MODULE BASED ON MAGNETICALLY EXTENDED CIRCUIT

BACKGROUND OF THE INVENTION

1. Field of the Invention

The present invention relates to the technical field of solar cell module, in particular to an infinitely extendable solar cell module based on a circuit extendable though magnetic engagement.

2. Background of the Invention

In recent years, there has been an energy shortage worldwide, which promotes the rapid development and wide application of solar energy technology in various production or living areas. From large scale power generation systems that can supply homes and factories to portable solar power banks that can charge electronic products such as mobile phones and PDAs, they are the key development direction of solar energy technology. The objection of the invention is to develop a portable-type solar cell. Because solar panel is usually of a plate-like structure, it is not convenient to carry it. Especially when the required supply power is high, the area of the panel is thus required to be increased, thus the carrying of such a panel with a large area is troublesome, and even impossible. At present, solar panels are mostly packaged individually, and supply power independently. There is no such a solar panel that is both portable and extendable. The invention further increases the portability of flexible and semi-flexible solar panels and resolves the problem of low efficiency and insufficient power of the battery panel. Furthermore, the cost is greatly reduced, so as to make it possible for solar energy to be utilized by more households.

SUMMARY OF THE INVENTION

One of the objects of the invention is to solve the existing problems as aforementioned, and to provide an infinitely extendable solar cell module based on a circuit extendable through magnetic engagement.

1. An infinitely extendable solar cell module based on a circuit extendable through magnetic engagement, characterized by comprising a circuit (1), a battery piece (2), a transparent layer (4), a magnetic engagement element (6); wherein, the battery piece (2) is connected with the magnetic engagement element (6) by the circuit (1), the battery module is adapted to be connected to another battery module by the magnetic engagement element (6), and the transparent layer (4) is on the surface of the battery module.

2. The infinitely extendable solar cell module based on a circuit extendable through magnetic engagement according to above item 1, characterized by further comprising a film layer (3), magnetic microbodies (5) and an electrode (7); wherein the magnetic microbodies (5) are magnetic particles distributed on the surface of the magnetic engagement element (6).

3. The infinitely extendable solar cell module based on a circuit extendable through magnetic engagement according to above item 2, characterized in that the magnetic microbodies (5) are symmetrically distributed on the surface of the magnetic engagement element (6) and through the transparent layer (4).

4. The infinitely extendable solar cell module based on a circuit extendable through magnetic engagement according to above item 2, characterized in that the film layer (3) is provided with several battery pieces (2) connected in series or in parallel.

5. The infinitely extendable solar cell module based on a circuit extendable through magnetic engagement according to above item 1, characterized in that the magnetic engagement element (6) is symmetrically distributed at the edge between the solar modules.

6. The infinitely extendable solar cell module based on a circuit extendable through magnetic engagement according to above item 2, characterized in that the magnetic engagement element (6) at the top is connected with the electrode (7) of the battery module and the electrode (7) of the battery module is adapted to be connected to a load.

7. The infinitely extendable solar cell module based on a circuit extendable through magnetic engagement according to above item 1, characterized in that the battery piece (2) is a battery piece that is textured twice and coated twice, the transparent layer (4) is a transparent layer that are coated twice, and the clamping device or electromagnetic field device for texturing has a flip structure.

8. The infinitely extendable solar cell module based on a circuit extendable through magnetic engagement according to above item 1, characterized in that a surface of the magnetic engagement element (6) has a section of one or more shapes selected from the group comprising a circle, an ellipse, a parabola, a straight line segment, or a combination of these shapes.

9. The infinitely extendable solar cell module based on a circuit extendable through magnetic engagement according to above item 1, characterized in that an engagement surface of the magnetic engagement element (6) is one of planar, convex, concave and their combination.

10. The infinitely extendable solar cell module based on a circuit extendable through magnetic engagement according to above item 1, characterized in: the battery piece (2) is an amorphous cell or crystalline silicon cell.

The beneficial effects of the present invention are as follows: the battery module are conveniently snap engaged with each other, which avoids individual packing and resolves the bottleneck of extendibility, and also resolves the bottleneck that the individual user needs welding to extend the batteries so that the battery cannot be widely applied. This solves the most important problem of popularization of the battery cell while increasing the portability and reducing the cost. Furthermore, it reduces the problem of component damage caused by engagement shock. It has anti-wear and self-cleaning effect, reducing the power loss of long-time use. The contact area between the battery piece and the backplane is increased, ensuring the export of more carriers and passivating the defect of the battery piece. The batteries can be extended to any area and power, reducing the dependence of the photovoltaic system on the conversion efficiency. The present invention is not limited by the material and can use either a rigid material or a flexible or a semi-flexible material. The separation of the interface and the solar panel is achieved, further improving the portability and increasing the flexibility of use.

DETAILED DESCRIPTION OF THE INVENTION

Figure 1:
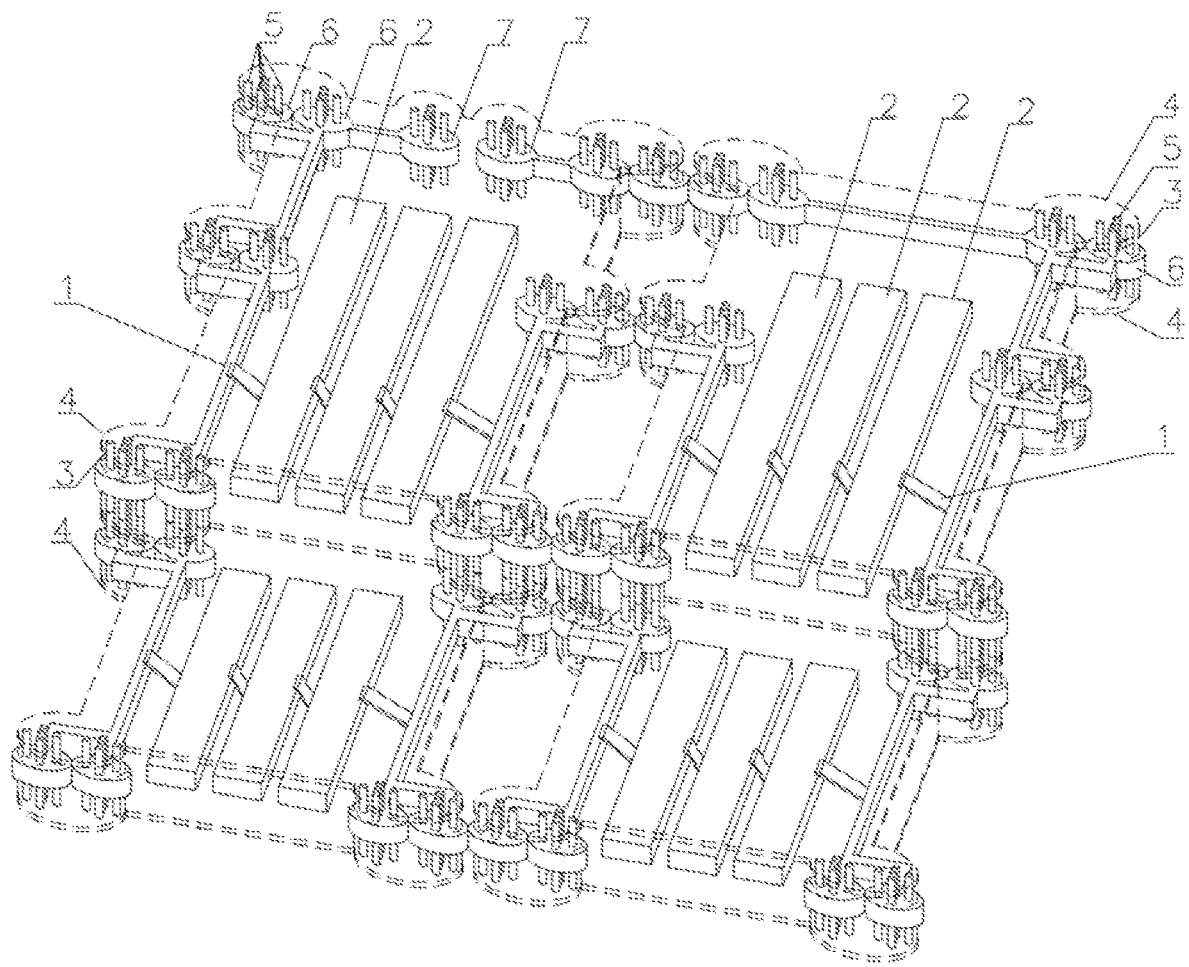
FIG. 1 is a schematic view of the structure of an infinitely extendable solar cell module based on a circuit extendable through magnetic engagement.

As shown in FIG. 1, an infinitely extendable solar cell module based on a circuit extendable through magnetic engagement, characterized by comprising a circuit 1, a battery piece 2, a film layer 3, a transparent layer 4, magnetic microbodies 5 and magnetic engagement elements 6, wherein the surface of the battery module has the transparent layer 4, the film layer 3 is provided with several battery pieces 2 connected in series, and the several battery pieces 2 are connected to the magnetic engagement elements 6 by being connected in series to the circuit 1. The battery modules can be connected to each other through the magnetic engagement elements 6, and the magnetic microbodies 5 are magnetic particles distributed on the surface of the magnetic engagement elements 6.

In addition, the transparent layer 4 may be provided on the upper surface of the battery module, and the film layer 3 in the middle of or below the transparent layer 4 is provided with the battery pieces 2 connected in series.

The magnetic microbodies 5 are symmetrically distributed on the surface of the magnetic engagement elements 6 and through the transparent layer 4. This kind of engagement reduces the impact caused by the engagement. The magnetic engagement elements 6 at the edge of the solar module are symmetrically distributed, so as to ensure the reliability and extendibility of the engagement. The magnetic engagement element 6 on top is connected to the electrodes 7 of the battery module, and the separation of the interface and the panel is achieved in the connection between the electrodes 7 of the battery module and the load.

Further, the battery piece 2 is a battery piece that is textured twice and coated twice, increasing the contact area and the number of the carriers. The transparent layer 4 is coated twice so as to reduce the power loss when the battery module is used for a long time. The clamping device or electromagnetic field device for texturing has a flip structure, reducing the resistance effect caused by the infiltration of a single load carriers.

The present invention provides a photovoltaic system and a method and apparatus for manufacturing the same. More specifically, The embodiments of the present disclosure relate to providing a method of designing and manufacturing a solar cell with improved portability, and improving the portable solar panels. In the respective embodiments, the present invention provides a magnetic engagement element for connecting to another panel to ensure a firm connection between the battery panels. Other embodiments are possible.

The embodiments of the present disclosure provide a system and method for manufacturing a portable solar panel. The embodiments of the present invention greatly reduces the thickness of the battery panels by introducing the magnetic engagement element. The embodiments of the present invention utilizes an ultra-thin design to reduce the required amount of photovoltaic materials, so as to reduce the overall cost. It shall be noted that the specific embodiments are shown for illustrative purposes and represent some examples. It can be readily understood by those skilled in the art that there can be other changes, modifications and substations.

According to an embodiment of the present invention, the portable solar module comprises a magnetic engagement plate member, the magnetic engagement plate member comprises small magnets with a symmetrical and star-like distribution, and a few small-sized textured photovoltaic cells (each with a few photovoltaic bands connected by one or more buses) are assembled into a large photovoltaic packet. The large photovoltaic packet contains a circuit connected to the small magnets. In addition, as described below, the embodiments of the present disclosure provide a system and method for connecting the photovoltaic regions. Other embodiments are possible.

Although the orientation is not a part of the present invention, it can be readily recognized that the solar module, when being used, has a side facing the sun, as well as an opposite side, that is, a face facing away from the sun. Although the module can be applied in any orientation, the "upper" or "top" relates to the side facing the sun while the "lower" or "bottom" relates to the opposite side. Therefore, it is described that a component on top of another component will be closer to the upper side than the component below it.

The magnets for engagement are upgraded, which reduces the damage to the elements caused by the engagement shock. In this example, by welding the magnetic particles onto the surface of the magnetic engagement element, the damage to the magnetic engagement element with a large surface area is reduced. The symmetrical structure ensures the extendibility in any directions including the upper, lower, left and right directions, and the double magnet structure facilitates a firm engagement.

Figure 2:
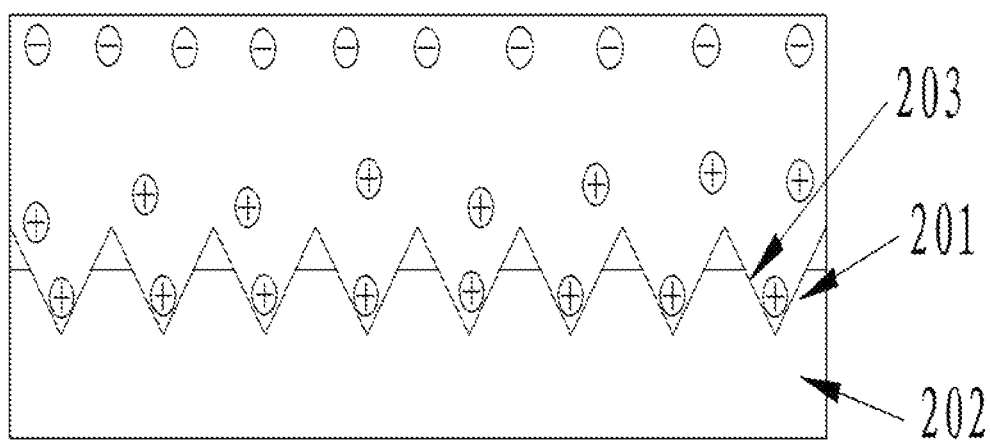
FIG. 2 is a simplified view of the photovoltaic module.

FIG. 2 is a simplified view of the photovoltaic module. The figure only shows an example and should not be regarded as limiting the scope of the present invention. Those skilled in the art may readily recognize many changes, substitutions, and modifications. As shown in FIG. 2, the photovoltaic module includes carriers 201, a back polar plate 202, and a battery piece 203. It can be seen that the textured structure has increased the contact area, while it is easier to export the carriers at the tips. The film structure includes the transparent layer and the battery piece both textured and coated with film, and the film structure wrapped around the entire surface of the battery panel.

Due to the coating treatment of the transparent layer, the battery panel has an anti-wear and self-cleaning effect, which greatly reduces the power loss of the portable solar panels. The layers, that is textured twice, of the battery plate increase the surface area of the battery piece, which makes the contact between the cell and the back plate more firmly and ensures a contact of the back polar plate with more carriers, while the aggregation effect of the electric charges at the tips makes the carriers' exportation easier. The coating on the dual layers of the battery piece increases the number of carriers, and has a good effect to passivate the defects of the battery piece. The use of coating on dual layers brings additional electron holes and holes. As an improvement of the coating structure, using sub-encapsulation to change the direction of the magnetic field may increase the penetration of the carrier, and reduce the resistance effect caused by the infiltration of a single load flow. This structure also avoids over-penetration due to time control problems. It shall be noted that the specific embodiments are shown for illustrative purposes and represent only examples. It is recognizable for one skilled in the art that there can be other changes, modifications and substitutions.

Extensions are of any area and power, as long as the number of battery modules per line is guaranteed to be the same, and then the number of columns of the battery modules with a double-layer magnetic engagement element structure, that are connected with each other, is equal to the total number of columns that battery panel to be set up. The double-layer magnetic engagement element is provided at any position with a positive and negative electrode outputs, so as to connect and provide power to a load.

As a result of the above technical scheme, the solar module panel of the present invention is not limited by the material of the battery piece, though a flexible or semi-flexible material is preferred. The cost, weight and volume are reduced, so that the thickness of the battery panel can theoretically be close to the thickness of the battery piece (less than 0.1 mm, and a flexible solar panel can be even thinner).

The separation of the output interface from the panel is realized, and the volume is further reduced. An extension of any area and power can be achieved, and it is made easier to carry, amount and detach the panel.

In respective embodiments, the magnetic engagement structure is formed by a plurality of circular components (sometimes called interface components) of the magnetic engagement element that extend along the longitudinal direction of the photovoltaic battery piece. For those embodiments where at least the components of the magnetic engagement element are located in the shared plane, their centerline is symmetrical to the outer edge of the battery panel. Each magnetic engagement element extends vertically along the direction of the specified band, and traverse to the direction of the cross band. It should be understood that a magnetic engagement element can also be of other shapes such as a basic square. The specified components of the magnetic engagement element are formed so that the parallel light incident onto the top surface of the magnetic engagement element is limited to an area with a transverse dimension smaller than the photovoltaic band when it reaches the plane of the photovoltaic band below. In the exemplary embodiment, although engagement can also occur on the lower surface of the battery panel, but the engagement also occurs on the upper surface. In fact, in the case of a standard connection, it can be provided that two small magnets are engage to one magnet so as to provide a circuit connection.

Usually the battery panel has a certain package width when it is installed, because the battery panel needs to be protected to make it wider than the effective area. In other words, when viewed through a magnetic engagement element, the overlapping width needs to be reduced as much as possible. To this end, the components of the magnetic engagement element are designed to be on the outer side of the battery panel. Therefore, from the point of view of incident sunlight, the solar module seems to be filled with effective photovoltaic materials throughout the outer surface.

Although the term magnetic engagement element is used, it can be referred to in the sense of the battery panel is engaged, and thus can be referred to as a magnet. Magnetic engagement element/magnet is also sometimes limited to saving the amount of photovoltaic materials. In addition, because the battery panels are usually slightly wider than the actual size of the battery panels in practice, especially in order to obtain lights that are incident at different angles, the area is usually smaller than ordinary magnets. The term magnetic engagement element is typically used.

The surface portion of the magnetic engagement element that provides connection has one or more sections that can be selected from the group including circle, ellipse, parabolic line, line segment, or combinations of these shapes. Although the part of the engagement surface (usually the upper surface) of the magnetic engagement element can be flat, the adsorption surface can be protruding (i.e., curved or arched) depending on application. For an embodiment where the cross section is a semicircle, the surface of the magnetic engagement element where it is placed is semi-cylindrical. However, an open arc less than 180° is usually used. Nonetheless, the term "annular" will not be used here. In some embodiments, the magnetic engagement element is a pressurized magnet, although other processing techniques (e.g. adhesion) and other materials (e.g. polymers) can be used.

It shall be understood that, the above specific description of the present invention is only used to illustrate the present invention and the present invention is not limited to the technical solutions described in the embodiments of the present invention. As will be understood by one skilled in the art, the present invention can be modified or substituted by the equivalent, in order to achieve the similar technical effect; as long as the purpose is met, these modification and substitution fall within the scope of protection of the present invention.

In summary, an infinite extendable solar cell module based on a circuit extendable through magnetic engagement is provided, including a circuit, a battery piece, a film layer, a transparent layer, magnetic micro bodies and magnetic engagement elements; wherein: a surface of the cell module is provided with the transparent layer, the film layer is connected to several battery pieces in series, the several battery pieces are connected to the magnetic engagement elements through the circuit connection, the cell module is connectable to another cell module through the magnetic engagement elements, the magnetic microbodies are the magnetic particles distributed on the surface of the magnetic engagement elements, the magnetic microbodies are symmetrically distributed on the surface of the magnetic engagement element and through the transparent layer, the magnetic engagement elements are symmetrically distributed at the edge of the solar module, the magnetic engagement element on top is connected with the positive and negative electrodes of the battery module, and the positive and negative electrode of the battery module are connected to a load. This battery module uses a convenient engagement connection without the use of an individual packaging, so as to avoid the bottleneck that the battery module cannot be extended, and large-scale spreading cannot be implemented due to the fact in prior art that soldering is required during extension for an individual user, which improves portability and reduces costs.

The invention claimed is:

1. An infinitely extendable solar battery module based on a circuit extendable through magnetic engagement, comprising a circuit, a plurality of battery pieces, a film layer, a first transparent layer, a second transparent layer, a plurality of magnetic microbodies, an electrode, and a plurality of magnetic engagement elements; wherein, the first transparent layer is provided on a top surface of the battery module and the second transparent layer is provided on a bottom surface of the battery module, the film layer provided between the first transparent layer and the second transparent layer is provided with the battery pieces that are connected in series or in parallel, the battery pieces are connected with the magnetic engagement elements by the circuit, the battery module is adapted to be connected to another battery module by the magnetic engagement elements, the magnetic microbodies comprise magnetic particles distributed on surfaces of the magnetic engagement elements, the magnetic microbodies are symmetrically distributed on the surfaces of the magnetic engagement elements and through the transparent layer, the magnetic engagement elements are symmetrically distributed at an edge defined between adjacent solar battery modules, the magnetic engagement element at the top is connected with the electrode of the battery module, and the electrode of the battery module is adapted to be connected to a load.

2. The infinitely extendable solar battery module based on a circuit extendable through magnetic engagement according to claim 1, wherein the surfaces of the magnetic engagement elements have a section of one or more shapes selected from a group comprising a circle, an ellipse, a parabola, a straight line segment, or a combination of these shapes.

3. The infinitely extendable solar battery module based on a circuit extendable through magnetic engagement according to claim 1, wherein an engagement surface of any of the magnetic engagement elements is one of planar, convex, concave and their combination.

4. The infinitely extendable solar battery module based on a circuit extendable through magnetic engagement according to claim 1, wherein the battery piece is an amorphous battery or crystalline silicon battery.

* * * * *